(12) United States Patent
Ahn et al.

(10) Patent No.: US 8,178,375 B2
(45) Date of Patent: May 15, 2012

(54) METHOD OF DETERMINING COMPOUND RATIO OF COMPOUND SEMICONDUCTOR FOR LIGHT GENERATING DEVICE

(75) Inventors: Do-Yeol Ahn, Seoul (KR); Seoung-Hwan Park, Daegu (KR); Jung-Tae Jang, Gyeonggi-do (KR)

(73) Assignee: Wooree LST Co. Ltd. (KR)

( * ) Notice: Subject to any disclaimer, the term of this patent is extended or adjusted under 35 U.S.C. 154(b) by 0 days.

(21) Appl. No.: 12/996,051

(22) PCT Filed: Oct. 9, 2008

(86) PCT No.: PCT/KR2008/005929
§ 371 (c)(1),
(2), (4) Date: Feb. 14, 2011

(87) PCT Pub. No.: WO2009/148204
PCT Pub. Date: Dec. 10, 2009

(65) Prior Publication Data
US 2011/0168973 A1 Jul. 14, 2011

(30) Foreign Application Priority Data

Jun. 5, 2008 (KR) .......................... 10-2008-0053104

(51) Int. Cl.
*H01L 21/00* (2006.01)
(52) U.S. Cl. ................. 438/46; 438/77; 438/93; 438/94; 257/E33.049
(58) Field of Classification Search .................... 438/46, 438/77, 93, 94; 257/E33.04
See application file for complete search history.

(56) References Cited

U.S. PATENT DOCUMENTS

| | | | |
|---|---|---|---|
| 6,229,151 B1 | 5/2001 | Takeuchi et al. | |
| 6,630,692 B2 | 10/2003 | Goetz et al. | |
| 6,995,389 B2 | 2/2006 | Kim et al. | |

*Primary Examiner* — Marcos D. Pizarro
*Assistant Examiner* — Eva Yan Montalvo
(74) *Attorney, Agent, or Firm* — Samuel Digirolamo; Husch Blackwell LLP (57) ABSTRACT

A method of manufacturing a light generating device with required wavelength is disclosed. According to the method, a) a required wavelength is determined. b) A polar angle and an azimuthal angle corresponding to the required wavelength in a nitride semiconductor are determined. Then, c) a nitride semiconductor crystal is grown according to the polar angle and the azimuthal angle. Therefore, a light generating device with required wavelength may be manufactured without adjusting amounts of elements of compound semiconductor.

7 Claims, 3 Drawing Sheets

METHOD OF DETERMINING COMPOUND RATIO OF COMPOUND SEMICONDUCTOR FOR LIGHT GENERATING DEVICE

TECHNICAL FIELD

The present invention relates to a light generating device including compound semiconductor and a method of determining ratio of elements in compound semiconductor for light generating device.

BACKGROUND ART

III-V group nitride compound semiconductor having a wide bandgap of about 1.9 eV (InN) to about 6.2 eV (AlN) has been widely used for a light emitting diode (LED), a laser diode (LD), a UV detector, etc., generating light with a wavelength in a range of about UV region and visible light region. Aluminum nitride (AlN), gallium nitride (GaN), indium nitride (InN), etc. have been considered as a useful material for optical and electrical application, since these materials may have continuous solid solution such as InGaN, InAlN, AlGaN, etc., and it is possible to adjust wavelength of light generated by a light generating device by changing a ratio of compound of quantum well layer of the light generating device.

A band gap of the nitride compound in a Wurtzite phase is in a range of about 1.9 eV to about 6.2 eV In detail, a-InN has a band gap of about 1.6 eV, a-GaN has a band gap of about 3.4 eV, and a-AlN has a band gap of about 6.2 eV. Furthermore, comparing conventional ZnS, InP and GaAs, nitride compound has relatively high thermal conductivity, and relatively high melting point so that the nitride compound is stable in high temperature. Additionally, nitride compound has good mechanical, physical and chemical characteristics such as corrosion resistance, thermal endurance, etc., so that nitride compound is noted not only for optical device but also for high temperature, high voltage, high power, high frequency electronic device.

Electronic devices based on GaN has been rapidly developed as a technique for growing thin film of GaN has been developed in 1980s. Akasaki et al. obtained good GaN thin film without cracks, using AlN buffer layer on sapphire (Al2O3) substrate through metalorganic chemical vapor deposition (MOCVD) method. In order to obtain good GaN crystal thin film, it is necessary to use substrate having a lattice constant and a coefficient of thermal expansion which are the same as that of GaN. That is, in order to reduce defects in the GaN thin film layer, a homo-epitaxy method using bulk GaN as a substrate is much more advantageous than a hetero-epitaxy method.

Nevertheless, GaN has not been used as a substrate because of high melting point and partial pressure of nitrogen. The melting point of GaN is about 2800 K, and the partial pressure of nitride is about 103 atm at a temperature of about 1200° C. Therefore, the homo-epitaxy method using bulk GnN is not widely used because of critical condition of the high melting point and the partial pressure of nitrogen.

As a result, the GaN thin film is grown on a different substrate, for example such as (0001)sapphire, (0001)SiC, etc. The (0001)sapphire substrate has about 13% lattice defect with GaN, and the (0001)SiC substrate has about 4% lattice defect with GaN. Therefore, the (0001)SiC substrate is more effective. However, the (0001)SiC substrate is less productive than the (0001)sapphire substrate, so that the (0001) SiC substrate is ten times expensive than the (0001)sapphire substrate. Therefore, most research groups use the (0001) sapphire substrate for growing GaN.

However, many defects may be generated at a boundary region between the (0001)sapphire substrate and the GaN thin film due to lattice defect of the 13%, and the 13% difference in the coefficient of thermal expansion between the (0001)sapphire substrate and the GaN thin film during a process of growing an epytoxic layer. The above defects prevent electrons from moving or the above defects are operated as a non-radiative recombination center to deteriorate electrical and optical characteristics of GaN. Therefore, spinel (MgAl$_2$O$_4$), GaAs, LiGaO$_2$, MgO, etc., which have relatively small amount of lattice defects, have been researched as a material for the substrate, but these materials also are not so much fruitful. Furthermore, a sapphire substrate of M-plane (1010), R-plane(1102), A-plane(1120), etc., has been researched in place of a substrate of C-plane(0001), but these researches are not so much fruitful, also.

Therefore, other researches for minimizing defects such as a threading dislocation, which is generated during growing GaN on a sapphire substrate, have been performed. The representative example for minimizing defects is a buffer layer between the sapphire substrate and the GaN.

In 1983, Yoshida et al. use sapphire coated with AlN for the first time, Akasaki group reduces crack by depositing AlN buffer layer at a low temperature, and nowadays a low temperature GaN buffer layer are frequently used. Now, the low temperature GaN buffer layer is considered to be essential technology for growing GaN through a MOCVD method. The amorphous state or polycrystal low temperature buffer layer having about 20~40 nm thickness reduces deterioration of crystal structure, which is induced by lattice unconformity to grow GaN layer of high quality.

The low temperature AlN or GaN buffer layer make it possible to grow GaN layer on sapphire substrate. Furthermore, Amano et al. grow a GaN layer containing magnesium (Mg) through a low-energy electron beam irradiation (LEEBI) method to form a p-type GaN layer. As a result, a light generating device based on GaN is rapidly developed. However, the above LEEBI method has some weak point. That is, the electron beam has limitation for penetrating a GaN wafer. Therefore, only a surface of GaN wafer becomes the p-type.

Nakamura et al. obtained p-type GaN layer, of which resistivity is about 2 Ω·cm, under the condition of 700° C. by thermal annealing treatment. Further more Nakamura et al. diagnoses the effect of thermal annealing treatment and the effect of a hole compensation of p-type GaN by adjusting gas during thermal annealing treatment. According to the diagnoses, Mg—H complexes increases the resistance of GaN. Therefore, by removing hydrogen in Mg—H complexes in thermal annealing treatment using N$_2$ gas, the resistance can be lowered. Using the above, Nichia corporation commercialized a blue LED.

However, when the c-plane(0001), which is polar, is used as the growing plane of GaN, piezoelectric field is generated due to piezoelectric effect, so that hole and electron pair is separated by the piezoelectric field to reduce probability of combination of hole and electron. Therefore, efficiency is lowered.

DISCLOSURE OF INVENTION

Technical Problem

The technical problem of the present invention is providing a light generating device having improved light generating efficiency.

The technical problem of the present invention is also providing a method of determining compound ratio of compound semiconductor for light generating device.

Technical Solution

According to one aspect of the present invention, a light generating device includes an active layer, an n-type contact layer and a p-type contact layer. The active layer includes a multiple quantum well layer with a quantum well layer having a first compound semiconductor and a barrier layer having a second compound semiconductor. The quantum well layer and the barrier layer are alternately formed. A first sum of electric field induced by piezoelectricity and electric field induced by spontaneous polarization in the quantum well layer is substantially the same as a second sum of electric field induced by piezoelectricity and electric field induced by spontaneous polarization in the barrier layer. The n-type contact layer provides the active layer with electrons and the p-type contact layer provides the active layer with holes.

For example, the first compound semiconductor is indium gallium nitride (InGaN), and the second compound semiconductor is aluminum gallium indium nitride (AlGaInN). In detail, the first compound semiconductor is $In_{0.1}Ga_{0.9}N$, and the second compound semiconductor is $Al_{0.1}Ga_{0.9-y}In_yN$ ($0.15 \leq y \leq 0.175$).

According to another aspect of the present invention, a ratio of elements in the second compound semiconductor of the barrier layer is determined such that a first sum of electric field induced by piezoelectricity and electric field induced by spontaneous polarization in the quantum well layer is substantially the same as a second sum of electric field induced by piezoelectricity and electric field induced by spontaneous polarization in the barrier layer.

A ratio of elements in the first compound semiconductor of the quantum well layer may be determined to determine a wavelength of light generated by the light generating device, before the ratio of elements in the second compound semiconductor is determined.

The first compound semiconductor may be indium gallium nitride (InGaN), and the second compound semiconductor may be aluminum gallium indium nitride (AlGaInN).

The wave length may be determined by determining an amount x of indium (In) of indium gallium nitride ($In_xGa_{1-x}N$), in determining the ratio of elements in the first compound semiconductor.

In detail, the amount x of indium (In) of indium gallium nitride ($In_xGa_{1-x}N$) may be determined by following equation, $$w = 11.78x + 350.84,$$

wherein w is a wavelength of light generated by the light generating device in nanometer scale.

An amount y of indium (In) of aluminum indium gallium ($Al_{0.1}Ga_{0.9-y}In_yN$) of the second compound semiconductor may be determined by following equation, $$y = 0.0538x + 0.0535,$$

wherein x is the amount of indium (In) of indium gallium nitride ($In_xGa_{1-x}N$).

A ratio of elements in the first compound semiconductor and the second compound semiconductor may be determined by following Hamiltonian $H(k, \in)$, $$H(k, \in) = \begin{pmatrix} F & -K^* & -H^* & 0 & 0 & 0 \\ -K & G & H & 0 & 0 & \Delta \\ -H & H^* & \lambda & 0 & \Delta & 0 \\ 0 & 0 & 0 & F & -K & H \\ 0 & 0 & \Delta & -K^* & G & -H^* \\ 0 & \Delta & 0 & H^* & -H & \lambda \end{pmatrix} \begin{matrix} |U_1> \\ |U_2> \\ |U_3> \\ |U_4> \\ |U_5> \\ |U_6> \end{matrix}$$

wherein $F = \Delta_1 + \Delta_2 + \lambda + \theta$ $G = \Delta_1 - \Delta_2 + \lambda + \theta$ $\lambda = \frac{\hbar^2}{2m_o}[A_1 k_z^2 + A_2(k_x^2 + k_y^2)] + D_1 \in_{zz}^{(0)} + D_2(\in_{xx}^{(0)} + \in_{yy}^{(0)})$ $\theta = \frac{\hbar^2}{2m_o}[A_3 k_z^2 + A_4(k_x^2 + k_y^2)] + D_3 \in_{zz}^{(0)} + D_4(\in_{xx}^{(0)} + \in_{yy}^{(0)})$ $K = \frac{\hbar^2}{2m_o} A_5 (k_x + ik_y)^2$ $H = \frac{\hbar^2}{2m_o} A_6 (k_x + ik_y) k_z$ and $|U_1> = -\frac{1}{\sqrt{2}} |(X+iY)\uparrow>$ $|U_2> = \frac{1}{\sqrt{2}} |(X-iY)\uparrow>$ $|U_3> = |Z\uparrow>$ $|U_4> = \frac{1}{\sqrt{2}} |(X-iY)\downarrow>$ $|U_5> = -\frac{1}{\sqrt{2}} |(X+iY)\downarrow>$ $|U_6> = |Z\downarrow>.,$ wherein, the $A_i$'s are the valence band effective mass parameters which is similar to the Luttinger parameters in a ZB crystal, the $D_i$'s are deformation potentials for wurtzite crystals, $k_i$'s are the wave vector, $\in_{ij}$ is the strain tensor, $\Delta_1$ is the crystal-field split energy, and $\Delta_2$ and $\Delta_3$ account for spin-orbit interactions.

Advantageous Effects

According to the light generating device of the present invention, the first sum of electric field induced by piezoelectricity and electric field induced by spontaneous polarization in the quantum well layer is substantially the same as a second sum of electric field induced by piezoelectricity and electric field induced by spontaneous polarization in the barrier layer to compensate internal field of the active layer. Therefore, light generating efficiency is improved.

According to the method of determining ratio of elements in compound semiconductor for light generating device, when the wavelength of light generated by a desired light generating device is determined, the ratio of compound of the quantum well layer is determined, and then the ratio of the barrier layer is determined to remove internal field of the active layer. Therefore, a light generating device having improved efficiency may be generated through the method.

BRIEF DESCRIPTION OF THE DRAWINGS

The above and other features and advantages of the present invention will become more apparent by describing in detailed exemplary embodiments thereof with reference to the accompanying drawings, in which:

In FIG. 3, (a) is a graph showing a relationship between a ratio y of indium in four-elements barrier layer and a ratio x of indium in three-elements quantum well in the multiple quantum well structure of $In_xGa_{1-x}N/Al_{0.1}Ga_{0.9-y}In_yN$ with zero internal field, of which quantum well has 3 nm thickness, and (b) is a graph showing a relationship between a transition wavelength and the ratio x of indium in three-elements quantum well in the multiple quantum well structure of $In_xGa_{1-x}N/Al_{0.1}Ga_{0.9-y}In_yN$ with zero internal field, of which quantum well has 3 nm thickness;

In FIG. 4, (a) is a graph showing a relationship between normalized optical matrix elements $|M|^2$ and the in-plane wave vector $k_\parallel$ for several indium composition, and (b) is a graph showing a relationship between quasi-Fermi energy separation and the ratio x of indium composition.

In FIG. 5, (a) is a graph showing a relationship between optical gain spectra with many-body effects and the wavelength for 3 nm $GaN/Al_{0.1}Ga_{0.9-y}In_yN$ structure with y=0.05, and (b) is a graph showing a relationship between peak gain and the ratio y of the indium composition in the 3 nm $In_xGa_{1-x}N/Al_{0.1}Ga_{0.9-y}In_yN$ quantum well structure with zero internal field.

BEST MODE FOR CARRYING OUT THE INVENTION

The invention is described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the size and relative sizes of layers and regions may be exaggerated far clarity.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein far ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be described in detail with reference to the accompanying drawings.

Hereinafter, theoretical background of the present invention will be explained.

The Hamiltonian for the valence-band structure has been derived by using k·p method (S. L. Chung and C. S. Chang, "The k·p method for strained wurtzite semiconductors". Phys. Rev. B, vol. 54, pp. 2491-2504, 1996).

Analysisin C-plain

The c-plane Hamiltonian for the (0001)-oriented wurtzite crystal can be written as the following Expression 1.

$$H(k, \in) = \begin{pmatrix} F & -K^* & -H^* & 0 & 0 & 0 \\ -K & G & H & 0 & 0 & \Delta \\ -H & H^* & \lambda & 0 & \Delta & 0 \\ 0 & 0 & 0 & F & -K & H \\ 0 & 0 & \Delta & -K^* & G & -H^* \\ 0 & \Delta & 0 & H^* & -H & \lambda \end{pmatrix} \begin{pmatrix} U_1 > \\ U_2 > \\ U_3 > \\ U_4 > \\ U_5 > \\ U_6 > \end{pmatrix} \quad \text{Expression 1}$$

where $$F = \Delta_1 + \Delta_2 + \lambda + \theta$$

$$G = \Delta_1 - \Delta_2 + \lambda + \theta$$

$$\lambda = \frac{\hbar^2}{2m_o}[A_1 k_z^2 + A_2(k_x^2 + k_y^2)] + D_1 \epsilon_{zz}^{(0)} + D_2(\epsilon_{xx}^{(0)} + \epsilon_{yy}^{(0)})$$

$$\theta = \frac{\hbar^2}{2m_o}[A_3 k_z^2 + A_4(k_x^2 + k_y^2)] + D_3 \epsilon_{zz}^{(0)} + D_4(\epsilon_{xx}^{(0)} + \epsilon_{yy}^{(0)})$$

$$K = \frac{\hbar^2}{2m_o}A_5(k_x + ik_y)^2$$

$$H = \frac{\hbar^2}{2m_o}A_6(k_x + ik_y)k_z$$

Here, the $A_i$'s are the valence band effective mass parameters which is similar to the Luttinger parameters in a ZB crystal, the $D_i$'s are deformation potentials for wurtzite crystals, $k_i$'s are the wave vector, $\in_{ij}$ is the strain tensor, $\Delta_1$ is the crystal-field split energy, and $\Delta_2$ and $\Delta_3$ account for spin-orbit interactions. Here, $\in_{xx}^{(0)}=(a_s-a_e)/a_e$ and $\in_{zz}^{(0)}=(c_s-c_e)/c_e$, which are due to mismatches between the lattice constants of the well ($a_e$ and $c_e$) and the substrate ($a_s$ and $c_s$). The bases for the Hamiltonian are defined as the following Expression 2.

$$|U_1\rangle = -\frac{1}{\sqrt{2}}|(X+iY)\uparrow\rangle$$

$$|U_2\rangle = \frac{1}{\sqrt{2}}|(X-iY)\uparrow\rangle$$

$$|U_3\rangle = |Z\uparrow\rangle$$

$$|U_4\rangle = \frac{1}{\sqrt{2}}|(X-iY)\downarrow\rangle$$

$$|U_5\rangle = -\frac{1}{\sqrt{2}}|(X+iY)\downarrow\rangle$$

$$|U_6\rangle = |Z\downarrow\rangle .$$

Expression 2

The optical momentum matrix elements for the c-plane are given by the following Expression 3.

$$|\hat{e}\cdot M^\eta|^2 = |\langle\Psi_l^{c\eta}|\hat{e}\cdot p|\Psi_m^v\rangle|^2 \quad \text{Expression 3}$$

Where $\Psi^c$ and $\Psi^v$ are functions for the conduction and the valence bands, respectively, and $\eta$ denotes spin-up state ($\uparrow$) or spin-down state ($\downarrow$) for both electron spins. In case of the spin-up state of the TE polarization, the polarization-dependent interband momentum-matrix elements can be written as the following Expression 4.

$$|\hat{e}\cdot M^\uparrow|^2 = \left|\cos\phi\frac{P_x}{\sqrt{2}}\{-\langle g_m^{(1)}|\phi_l\rangle + \langle g_m^{(2)}|\phi_l\rangle\} - i\sin\phi\frac{P_y}{\sqrt{2}}\{\langle g_m^{(4)}|\phi_l\rangle + g_m^{(2)}|\phi_l\rangle\}\right|^2 \quad \text{Expression 4}$$

In case of the spin-down state of the TE polarization, the polarization-dependent interband momentum-matrix elements can be written as the following Expression 5.

$$|\hat{e}\cdot M^\downarrow|^2 = \left|\cos\phi\frac{P_x}{\sqrt{2}}\{\langle g_m^{(4)}|\phi_l\rangle - \langle g_m^{(5)}|\phi_l\rangle\} - i\sin\phi\frac{P_y}{\sqrt{2}}\{\langle g_m^{(4)}|\phi_l\rangle + g_m^{(5)}|\phi_l\rangle\}\right|^2 \quad \text{Expression 5}$$

In the Expression 4 and Expression 5, $$\hat{e} = \cos\phi\hat{x} + \sin\phi\hat{y}$$

In case of the spin-up state of the TM polarization, the polarization-dependent interband momentum-matrix elements can be written as the following Expression 6.

$$|\hat{e}\cdot M^\uparrow|^2 = |P_z\langle g_m^{(3)}|\phi_l\rangle|^2 \quad \text{Expression 6}$$

In case of the spin-down state of the TM polarization, the polarization-dependent interband momentum-matrix elements can be written as the following Expression 7.

$$|\hat{e}\cdot M^\downarrow|^2 = |P_z\langle g_m^{(6)}|\phi_l\rangle|^2 \quad \text{Expression 6}$$

In the Expression 6 and Expression 7, $$\hat{e} = \hat{z},$$

and In the Expression 6 through Expression 7, $$g_m^{(v)} \; (v=1, 2, 3, 4, 5, \text{ and } 6)$$

is wave function for the mth subband in (x, y, z) coordinate. $P_x$, $P_1^2$, $P_2^2$ are expressed as the following Expression 8.

$$P_x = P_y = \langle S|p_x|X\rangle = \langle S|p_y|Y\rangle \quad \text{Expression 8}$$
$$= \frac{m_o}{\hbar}P_2, \; P_z = \langle S|p_z|Z\rangle = \frac{m_o}{\hbar}P_1,$$

$$P_1^2 = \frac{\hbar^2}{2m_o}\left(\frac{m_o}{m_e^z}-1\right)\frac{(E_g+\Delta_1+\Delta_2)(E_g+2\Delta_2)-2\Delta_3^2}{E_g+2\Delta_2},$$

$$P_2^2 = \frac{\hbar^2}{2m_o}\left(\frac{m_o}{m_e^t}-1\right)\frac{E_g[(E_g+\Delta_1+\Delta_2)(E_g+2\Delta_2)-2\Delta_3^2]}{(E_g+\Delta_1+\Delta_2)(E_g+\Delta_2)-\Delta_3^2}.$$

Analysis of Electric Field Induced by Piezoelectric in Quantum Well

When a stress $\tau_{jk}$ is applied to nitride compound semiconductor, electric field is induced by piezoelectric in proportional to the stress $\tau_{jk}$ as shown in Expression 9.

$$P_i = d_{ijk}\tau_{jk}, \quad \text{Expression 9}$$

wherein $d_{ijk}$ is tensor element of Piezoelectric.

The tensor element of $\tau_{jk}$, may be expressed as the following Expression 10.

$$\tau_{ij} = C_{ijkl}\in_{kl}, \quad \text{Expression 10}$$

wherein, $C_{ijkl}$ is stiffness constants of nitride compound semiconductor with Wurtzite structure. Here it is convenient to replace the tensor notation by the engineering notation for $d_{ijk}$ and $c_{ijkl}$ using their symmetry properties. That is, the second and third subscripts in $d_{ijk}$ and the first two and last two subscripts in $c_{ijkl}$ are replaced by a single subscript running from 1 to 6 as follows.

$$\begin{pmatrix}P_x\\P_y\\P_z\end{pmatrix} = \begin{pmatrix}0 & 0 & 0 & 0 & d_{15} & 0\\ 0 & 0 & 0 & d_{15} & 0 & 0\\ d_{31} & d_{31} & d_{33} & 0 & 0 & 0\end{pmatrix} \quad \text{Expression 11}$$

$$\begin{pmatrix}c_{11} & c_{12} & c_{13} & 0 & 0 & 0\\ c_{12} & c_{11} & c_{13} & 0 & 0 & 0\\ c_{13} & c_{13} & c_{33} & 0 & 0 & 0\\ 0 & 0 & 0 & c_{44} & 0 & 0\\ 0 & 0 & 0 & 0 & c_{44} & 0\\ 0 & 0 & 0 & 0 & 0 & c_{66}\end{pmatrix}\begin{pmatrix}\in_{xx}\\ \in_{yy}\\ \in_{zz}\\ 0\\ 2\in_{xz}\\ 0\end{pmatrix}$$

From Expression 11, Expression 12 is obtained.

$$P_x = 2d_{15}c_{44}\in_{xz},$$

$$P_y = 0,$$

$$P_z = [d_{31}(c_{11}+c_{12})+d_{33}c_{13}](\in_{xx}+\in_{yy})+[2d_{31}c_{13}+d_{33}c_{33}]\in_{zz}. \quad \text{Expression 12}$$

The physical values of GaN and InN for numerical calculation are shown as following Table 1.

Non-Markovian Optical Gain with Many-body Effects

The optical gain spectra are calculated using the non-Markovian gain model with many body effects (S. H. Park, S. L. Chung and D. Ahn, "Interband relaxation time effects on non-Markovian gain with many-body effects and comparison with experiment", Semicond. Sci. Technol., vol. 15 pp. 2003-2008). The optical gain with many-body effects including the effects of anisotropy on the valence band dispersion is given by the following Expression 13.

$$g(\omega) = \sqrt{\frac{\mu_o}{\epsilon}} 2\left(\frac{e^2}{m_o^2\omega}\right) \int_o^{2x} d\phi_0 \int_0^{\infty} dk_{\|} \frac{2k_{\|}}{(2\pi)^2 L_w} \cdot$$
$$|M_{nm}(k_{\|}, \phi_0)|^2 [f_n^c(k_{\|}, \phi_0) - f_m^v(k_{\|}, \phi_0)] L(w, k_{\|}, \phi_0),$$

Expression 13 wherein ω is the angular frequency, $\mu_0$ is the vacuum permeability, $\in$ is the dielectric constant, σ=U (or L) refers to the upper (lower) blocks for the effective-mass Hamiltonian, e is the charge of an electron, $m_0$ is the free electron mass, $k_{\|}$ is the magnitude of the in-plane wave vector in the QW plane, $L_w$ is the well width, $|M_{lm}|^2$ is the momentum matrix element in the strained QW, $f_l^c$ and $f_m^v$ are the Fermi functions for occupation probability by the electrons in the conduction subband states, respectively, and the indices l and m denote the electron states in conduction subband and heavy hole (light hole) subband states, respectively.

Also, renormalized transition energy between electrons and holes is shown in the following Expression 14.

$$E_{lm}(k_{\|}, \hbar\omega, \phi_0) = E_l^c(k_{\|}, \phi_0) - E_m^v(k_{\|}, \phi_0) + E_g + \Delta E_{SX} + \Delta E_{CH} - \hbar\omega$$

Expression 14 wherein Eg is the band gap of the material, and $\Delta E_{SX}$ and $\Delta E_{CH}$ are the screened exchange and the Coulomb-hole contributions to the band-gap renormalization, respectively [W. W. Chou, M. Hagerott, A. Bimdt, and S. W. Koch, "Threshold conditions for an ultraviolet wavelength GaN quantum-well laser" IEEE J. Select. Topics Quantum Electron., vol. 4, pp. 514-1998].

The Gaussian line shape function $L(\omega, k_{\|}, \phi)$ renormalized with many-body effects is given by the following Expression 15.

$$L(w, k_{\|}, \phi_0) = \begin{pmatrix} (1 - \text{Re}Q(k_{\|}, \hbar\omega, \phi_0)) \\ \text{Re}L(E_{lm}(k_{\|}, \hbar\omega, \phi_0)) - \\ [mQ(k_{\|}, \hbar\omega, \phi_0)]\text{Im}L \\ (E_{lm}(k_{\|}, \hbar\omega, \phi_0)) \\ \hline (1 - \text{Re}Q(k_{\|}, \hbar\omega, \phi_0))^2 + \\ (\text{Im}Q(k_{\|}, \hbar\omega, \phi_0))^2 C \end{pmatrix}$$

Expression 15

The factor $Q(k_{\|}, \hbar\omega, \phi_0)$ accounts for the excitonic or Coulomb enhancement of the interband transition probability.

The line shape function is Gaussian for the simplest non-Markovian quantum kinetics and is given by the following Expression 16 and Expression 17.

$$\text{Re}[L(E_{lm}(k_{\|}, \hbar\omega, \phi_0))] = \sqrt{\frac{\pi\tau_{in}(k_{\|}, \hbar\omega, \phi_0)\tau_c}{2\hbar^2}} \exp\left(-\frac{\tau_{in}(k_{\|}, \hbar\omega, \phi_0)\tau_c}{2\hbar^2} E_{lm}^2(k_{\|}, \hbar\omega, \phi_0)\right)$$

Expression 16

$$\text{Im}[L(E_{lm}(k_{\|}, \hbar\omega, \phi_0))] = \frac{\tau_c}{\hbar} \int_0^{\infty} \exp\left(-\frac{\tau_c}{2\tau_{in}(k_{\|}, \hbar\omega, \phi_0)} t^2\right) \sin\left(\frac{\tau_c E_{lm}(k_{\|}, \hbar\omega, \phi_0)}{\hbar} t\right) dt$$

Expression 17

The interband relaxation time $\tau_{in}$ and the correlation time $\tau_c$ are assumed to be constant. the interband relaxation time $\tau_{in}$ and the correlation time $\tau_c$ are 25 and 10 fs, respectively.

The physical values of GaN and InN for numerical calculation are shown as following Table 1.

TABLE 1

| Parameters | | GaN | InN |
|---|---|---|---|
| Lattice constant | a ( ) | 3.1892 | 3.53 |
| EnergyParameter | Eg (ev) | 3.44 | 1.89 |
| | Δcr = $\Delta_1$ (meV) | 22.0 | 41.0 |
| | Δso = $3\Delta_2$ (meV) | 15.0 | 1.0 |
| | $\Delta_3 = \Delta_2$ | | |
| Conduction band-effective masses | $m_{ez}^w/m_0$ (=$m_{et}^w/m_0$) | 0.20 | 0.11 |
| Valence band | A1 | -6.4 | -9.09 |
| effective mass parameters | A2 | -0.5 | -0.63 |
| | A5 | -2.56 | -4.36 |
| | A3 = A2 − A1, | | |
| | A4 = A3/2, | | |
| | A6 = (A3 + 4A5)/√2 | | |
| Deformationpotentials (eV) | $a_c = -6.4 + a_v$ | -4.60 | -1.40 |
| | $D_1$ | -1.70 | -1.76 |
| | $D_2$ | 6.30 | 3.43 |
| | $D_5$ | -4.00 | -2.33 |
| | $D_3 = D_2 - D_1$ | | |
| | $D_4 = D_3/2$ | | |
| Dielectric constant | $\epsilon$ | 10.0 | 15.3 |
| Elastic stiffness-constant($10^{11}$dyn/cm$^2$) | $C_{11}$ | 39.0 | 27.1 |
| | $C_{12}$ | 14.5 | 12.4 |
| | $C_{13}$ | 10.6 | 9.4 |
| | $C_{33}$ | 39.8 | 20.0 |
| | $C_{44}$ | 10.5 | 4.6 |
| | $C_{66}$ | 12.3 | 7.4 |

TABLE 1-continued

| Parameters | | GaN | InN |
|---|---|---|---|
| Piezoelectric constant | $d_{31}$ (×10$^{-12}$ m/V) | −1.7 | −1.1 |
| Spontaneous polarization constant | P (C/m$^2$) | −0.029 | −0.032 |

Electric field in the quantum well layer may be expressed as following Expression 18.

$$F_Z^W = [(P_{SP}^b + P_{PZ}^b) - (P_{SP}^w + P_{PZ}^w)]/(\in^w + \in^b L_w/L_b), \quad \text{Expression 18}$$

wherein P means polarization, superscripts w and b mean well and barrier, respectively, and subscripts sp and pz mean spontaneous polarization and piezoelectric, respectively. L means thickness of layer and $\in$ means dielectric constant.

As shown in Expression 18, when a first sum of electric field induced by piezoelectricity and electric field induced by spontaneous polarization in the quantum well layer is substantially the same as a second sum of electric field induced by piezoelectricity and electric field induced by spontaneous polarization in the barrier layer, the internal fields of the active layer becomes zero or the internal fields of the active layer disappear. Therefore, holes and electrons are not influenced by the internal fields to increase probability of recombination between holes and electrons of the active layer.

Figure 1:
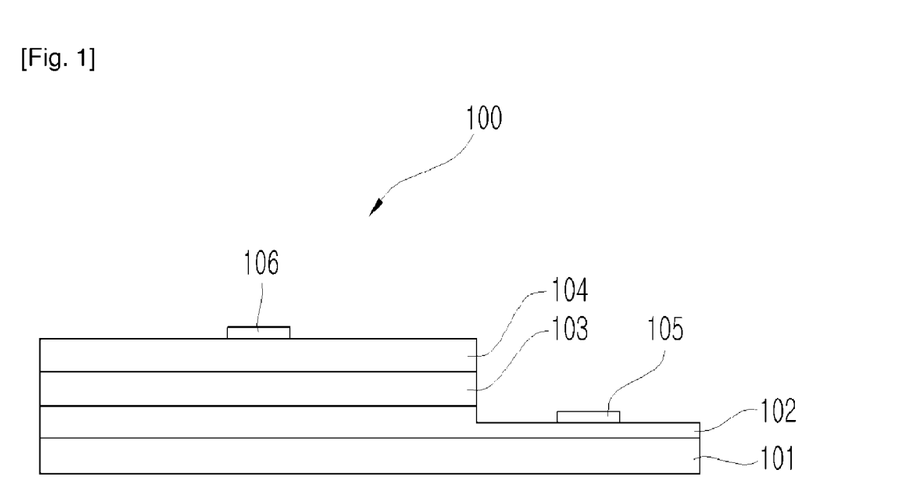
FIG. 1 is a cross-sectional view showing a light generating device according to an exemplary embodiment of the present invention.
Figure 2:
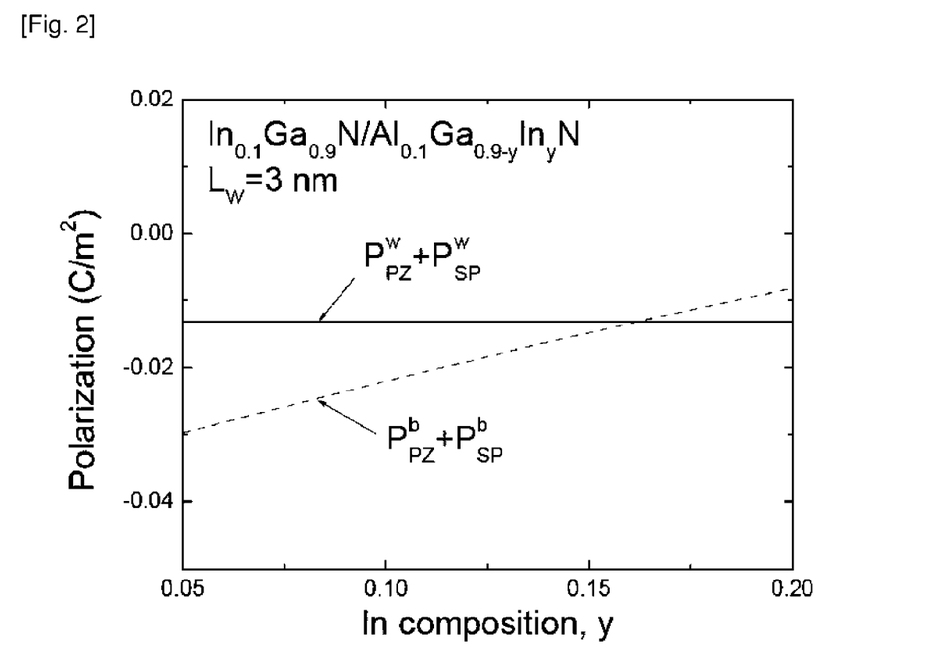
FIG. 2 is a graph showing a numerically calculated relationship between polarization and a ratio of indium of barrier layer in a multiple quantum well structure of $In_{0.1}Ga_{0.9}N/Al_{0.1}Ga_{0.9-y}In_yN$, of which quantum well has 3 nm thickness.

FIG. 2 is a graph showing a numerically calculated relationship between polarization and a ratio of indium of barrier layer in a multiple quantum well structure of $In_{0.1}Ga_{0.9}N/Al_{0.1}Ga_{0.9-y}In_yN$, of which quantum well has 3 nm thickness. In other words, FIG. 2 shows polarization as a function of a In composition y in the barrier layer of 3 nm $In_{0.1}Ga_{0.9}N/Al_{0.1}Ga_{0.9-y}In_yN$. In detail, the graph in FIG. 2 is obtained by applying values of Table 1 to Expression 12, using interpolation. For example, when $C_{11}[AlN]=10$ and $C_{11}[GaN]=5$, $C_{11}[Al_xGa_{(1-x)}N]$ is obtained by the equation of $10x+5(1-x)$. Additionally, experimental values are used for electric fields induced by spontaneous emission.

In the graph of FIG. 2, ratio of indium (In) is fixed as 0.1 in the quantum well layer and the barrier layer including four elements of Al, Ga, In and N, since technique for growing four elements layer is immature, so that it is very hard to grow the barrier layer including four elements with high Al ratio.

The ratio of elements in compound semiconductor of the quantum well layer relates to the wavelength of light generated by the light generating device, so that the ratio of elements in compound semiconductor of the quantum well layer is fixed. Therefore, the first sum of the electric field induced by induced by piezoelectricity and electric field induced by spontaneous polarization in the quantum well is shown to be constant in the graph of FIG. 2.

Varying ratio of elements in compound semiconductor of the barrier layer, the second sum of the electric field ($P_{PZ}^b$) induced by piezoelectricity and electric field ($P_{SP}^b$) induced by spontaneous polarization in the barrier layer is calculated, and then the ratio y of Indium composition in the compound semiconductor of the barrier layer is obtained to be about 0.163 where the first sum of electric field induced by piezoelectricity and electric field induced by spontaneous polarization in the quantum well layer is substantially the same as a second sum of electric field induced by piezoelectricity and electric field induced by spontaneous polarization in the barrier layer. The ratio y of indium composition in the compound semiconductor of the barrier layer may be allowable when the ratio y is in a range of about 0.15 to about 0.175.

Figure 3:
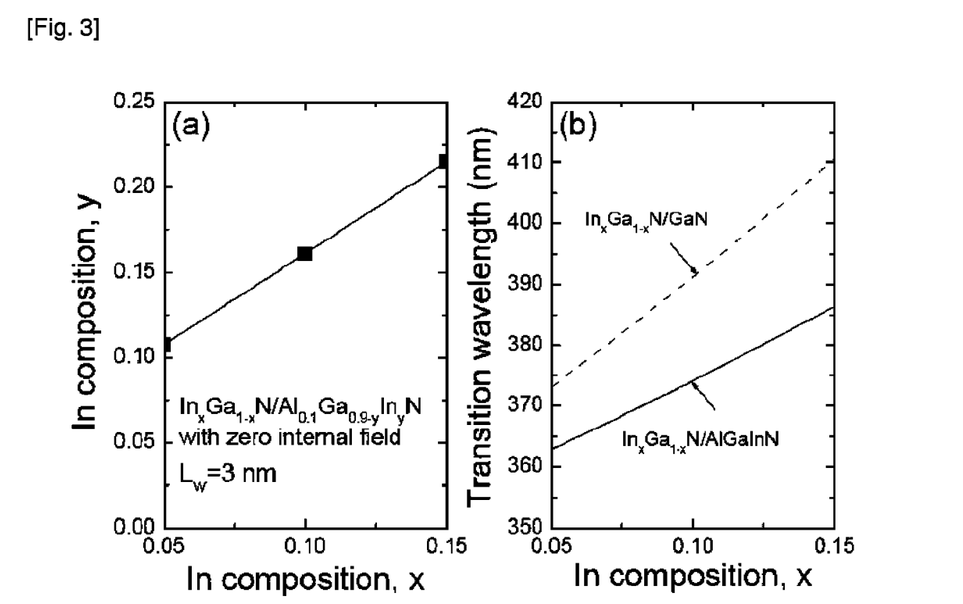

In FIG. 3, (a) is a graph showing a relationship between the ratio y of indium composition in four-elements barrier layer and a ratio x of indium in three-elements quantum well in the multiple quantum well structure of $In_xGa_{1-x}N/Al_{0.1}Ga_{0.9-y}In_yN$ with zero internal field, of which quantum well has 3 nm thickness, and (b) is a graph showing a relationship between a transition wavelength and the ratio x of indium in three-elements quantum well in the multiple quantum well structure of $In_xGa_{1-x}N/Al_{0.1}Ga_{0.9-y}In_yN$ with zero internal field, of which quantum well has 3 nm thickness. In other words, (a) is a graph showing indium composition y in the barrier layer as a function of indium composition x in the well of 3 nm $In_xGa_{1-x}N/Al_{0.1}Ga_{0.9-y}In_yN$ with zero internal field, and (b) is a graph showing transition wavelength as a function of indium composition x in the well of 3 nm $In_xGa_{1-x}N/Al_{0.1}Ga_{0.9-y}In_yN$ with zero internal field.

The dotted line corresponding to a transition wavelength when the internal field do not vanish, shows blueshift because of Quantum Stark effect.

According to graph (a) in FIG. 3, the ratio x of indium composition in the quantum well layer of $In_xGa_{1-x}N$, and the ratio y of indium composition in the barrier layer of $Al_{0.1}Ga_{0.9-y}In_yN$ satisfies the following Expression 19.

$$y = 0.0538x + 0.0535 \quad \text{Expression 19}$$

Using Expression 19, when the ration x of indium composition in the quantum well layer of $In_xGa_{1-x}N$ is determined, the ratio y of indium composition in the barrier layer of $Al_{0.1}Ga_{0.9-y}In_yN$, in which the internal field vanishes, may be obtained.

Additionally, according to graph (b) of FIG. 3, the ration x of indium composition in the quantum well layer of $In_xGa_{1-x}N$ and a wavelength w of light generated by the light generating device in nanometer scale satisfy following Expression 20.

$$w = 11.78x + 350.84 \quad \text{Expression 20}$$

Using Expression 20, when the wavelength w of light generated by desired light generating device is determined, the ration x of indium composition in the quantum well layer of $In_xGa_{1-x}N$ may be obtained.

Figure 4:
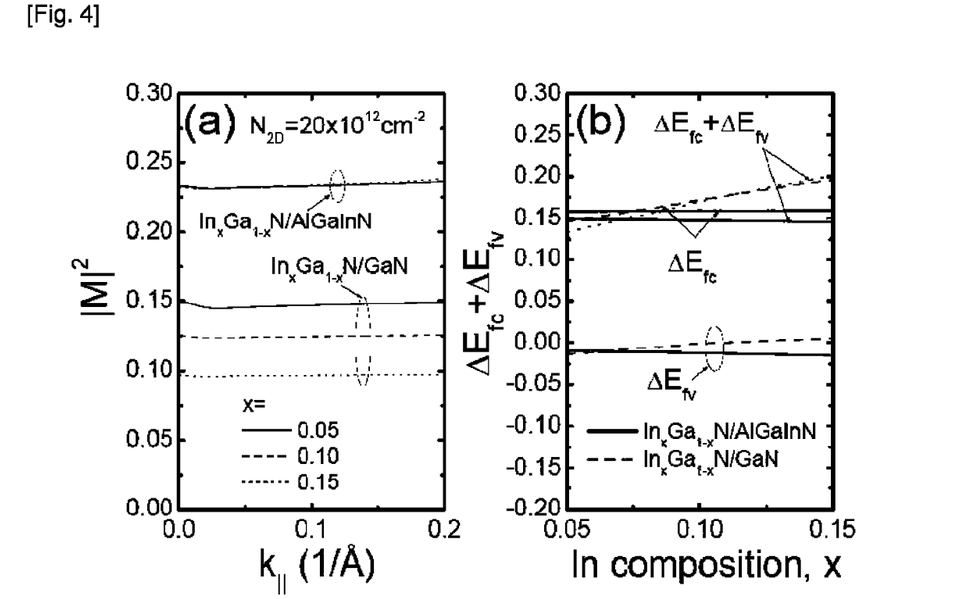

In FIG. 4, (a) is a graph showing a relationship between normalized optical matrix elements $|M|^2$ and the in-plane wave vector $k_\parallel$ for several indium composition, and (b) is a graph showing a relationship between quasi-Fermi energy separation and the ratio x of indium composition. In other words, (a) is a graph showing normalized optical matrix element as a function of the in-plane wave vector $k_\parallel$ for several indium compositions and (b) is a graph showing the quasi-Fermi energy separation as a function of the indium composition of 3 nm $In_xGa_{1-x}N/Al_{0.1}Ga_{0.9-y}In_yN$ quantum well structure with zero internal field. For comparison, a result of a conventional InGaN/GaN quantum well structure is plotted.

The optical matrix elements $|M|^2$ in (a) of FIG. 4 may be obtained from Expression 3. According to the conventional InGaN/GaN quantum well structure, when the ratio x of indium composition increases, the stress increases to increase the internal field, so that the optical matrix elements $|M|^2$ is reduced. However, according to the barrier layer of $Al_{0.1}Ga_{0.9-y}In_yN$ with zero internal field, the optical matrix elements $|M|^2$ is substantially constant, which is larger than the barrier layer having the internal field.

Figure 5:
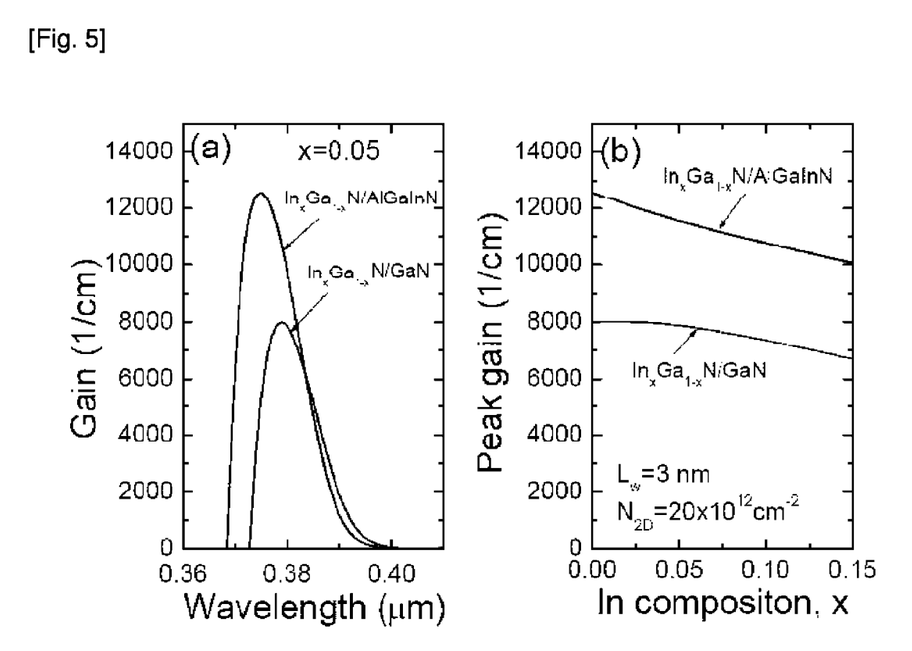

In FIG. 5, (a) is a graph showing a relationship between optical gain spectra with many-body effects and the wavelength for 3 nm $GaN/Al_{0.1}Ga_{0.9-y}In_yN$ structure with y=0.05, and (b) is a graph showing a relationship between peak gain and the ratio y of the indium composition in the 3 nm $In_xGa_{1-x}N/Al_{0.1}Ga_{0.9-y}In_yN$ quantum well structure with zero internal field. In other words, (a) shows optical gain spectra with many-body effects as a function of the wavelength for the 3 nm InGaN/AlGaInN quantum well structure with In=0.05, and (b) shows peak gain as a function of the indium composition in the well of 3 nm $In_xGa_{1-x}N/Al_{0.1}Ga_{0.9-y}In_yN$ quantum well structure with zero internal field. For comparison, a result of a conventional InGaN/GaN quantum well structure is plotted. The graphs in FIG. 5 are plotted by numerical calculation using Expression 13.

As shown in FIG. 5, when the internal field vanishes, the optical gain is enhanced by no less than about 50%.

As described above, according to the light generating device, the first sum of electric field induced by piezoelectricity and electric field induced by spontaneous polarization in the quantum well layer is substantially the same as a second sum of electric field induced by piezoelectricity and electric field induced by spontaneous polarization in the barrier layer, so that internal field of the active layer vanishes. Therefore, efficiency for generating light is enhanced.

According to the method of determining ratio of elements in compound semiconductor for a light generating device, a ratio of compound of quantum well layer may be determined when a wavelength of light generated by the light generating device is determined, and a ratio of compound of barrier layer, which is optimized, may be determined according to the ration of compound of the quantum well.

Having described the exemplary embodiments of the present invention and its advantages, it is noted that various changes, substitutions and alterations can be made herein without departing from the spirit and scope of the present invention as defined by the appended claims.

The invention claimed is:

1. A method of determining ratio of elements in compound semiconductor for light generating device having an active layer including a multiple quantum well layer with a quantum well layer having a first compound semiconductor and a barrier layer having a second compound semiconductor, the method comprising:
   determining a ratio of elements in the second compound semiconductor of the barrier layer such that a first sum of electric field induced by piezoelectricity and electric field induced by spontaneous polarization in the quantum well layer is substantially the same as a second sum of electric field induced by piezoelectricity and electric field induced by spontaneous polarization in the barrier layer.

2. The method of claim 1, further comprising determining a ratio of elements in the first compound semiconductor of the quantum well layer to determine a wavelength of light generated by the light generating device, prior to determining the ratio of elements in the second compound semiconductor.

3. The method of claim 2, wherein the first compound semiconductor is indium gallium nitride (InGaN), and the second compound semiconductor is aluminum gallium indium nitride (AlGaInN).

4. The method of claim 3, wherein the wave length is determined by determining an amount x of indium (In) of indium gallium nitride ($In_xGa_{1-x}N$), in determining the ratio of elements in the first compound semiconductor.

5. The method of claim 4, wherein the amount x of indium (In) of indium gallium nitride ($In_xGa_{1-x}N$) is determined by following equation, $$w = 11.78x + 350.84,$$

wherein w is a wavelength of light generated by the light generating device in nanometer scale.

6. The method of claim 5, wherein an amount y of indium (In) of aluminum indium gallium ($Al_{0.1}Ga_{0.9-y}In_yN$) of the second compound semiconductor is determined by following equation, $$y = 0.0538x + 0.0535,$$

wherein x is the amount of indium (In) of indium gallium nitride ($In_xGa_{1-x}N$).

7. The method of claim 2, wherein a ratio of elements in the first compound semiconductor and the second compound semiconductor is determined by following Hamiltonian $H(k, \epsilon)$, $$H(k, \epsilon) = \begin{pmatrix} F & -K^* & -H^* & 0 & 0 & 0 \\ -K & G & H & 0 & 0 & \Delta \\ -H & H^* & \lambda & 0 & \Delta & 0 \\ 0 & 0 & 0 & F & -K & H \\ 0 & 0 & \Delta & -K^* & G & -H^* \\ 0 & \Delta & 0 & H^* & -H & \lambda \end{pmatrix} \begin{vmatrix} U_1 > \\ U_2 > \\ U_3 > \\ U_4 > \\ U_5 > \\ U_6 > \end{vmatrix}$$

wherein $F = \Delta_1 + \Delta_2 + \lambda + \theta$ $G = \Delta_1 - \Delta_2 + \lambda + \theta$ $\lambda = \frac{\hbar^2}{2m_o}[A_1 k_z^2 + A_2(k_x^2 + k_y^2)] + D_1 \epsilon_{zz}^{(0)} + D_2(\epsilon_{xx}^{(0)} + \epsilon_{yy}^{(0)})$ $\theta = \frac{\hbar^2}{2m_o}[A_3 k_z^2 + A_4(k_x^2 + k_y^2)] + D_3 \epsilon_{zz}^{(0)} + D_4(\epsilon_{xx}^{(0)} + \epsilon_{yy}^{(0)})$ $K = \frac{\hbar^2}{2m_o} A_5 (k_x + i k_y)^2$ $H = \frac{\hbar^2}{2m_o} A_6 (k_x + i k_y) k_z$ and $|U_1> = -\frac{1}{\sqrt{2}} |(X + iY)\uparrow >$ $|U_2> = \frac{1}{\sqrt{2}} |(X - iY)\uparrow >$ $|U_3> = |Z\uparrow >$ $|U_4> = \frac{1}{\sqrt{2}} |(X - iY)\downarrow >$ $|U_5> = -\frac{1}{\sqrt{2}} |(X + iY)\downarrow >$ $|U_6> = |Z\downarrow >.,$ wherein, the $A_i$'s are the valence band effective mass parameters which is similar to the Luttinger parameters in a ZB crystal, the $D_i$'s are deformation potentials for wurtzite crystals, $k_i$'s are the wave vector, $\epsilon_{ij}$ is the strain tensor, $\Delta_1$ is the crystal-field split energy, and $\Delta_2$ and $\Delta_3$ account for spin-orbit interactions.

* * * * *